US011955574B2

(12) United States Patent
Li et al.

(10) Patent No.: US 11,955,574 B2
(45) Date of Patent: Apr. 9, 2024

(54) PHOTOVOLTAIC CELL FORM ULTRA-SMALL IOT DEVICE WITH MULTI-LEVEL VOLTAGE OUTPUT

(71) Applicant: International Business Machines Corporation, Armonk, NY (US)

(72) Inventors: Ning Li, White Plains, NY (US); Devendra Sadana, Pleasantville, NY (US); Ghavam G. Shahidi, Pound Ridge, NY (US); Chitra K. Subramanian, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 634 days.

(21) Appl. No.: 15/725,509

(22) Filed: Oct. 5, 2017

(65) Prior Publication Data

US 2019/0109250 A1   Apr. 11, 2019

(51) Int. Cl.
  *H01L 31/05*  (2014.01)
  *H01L 25/04*  (2023.01)
  *H01L 31/02*  (2006.01)

(52) U.S. Cl.
  CPC ........ *H01L 31/0508* (2013.01); *H01L 25/042* (2013.01); *H01L 25/043* (2013.01); *H01L 31/02019* (2013.01); *H01L 31/02021* (2013.01); *H01L 31/0504* (2013.01)

(58) Field of Classification Search
  CPC ............. H01L 31/03926; H01L 31/046; H01L 31/0465; H01L 31/0687; H01L 31/02019; H01L 31/02021; H01L 31/02024; H01L 31/03046; H01L 31/05; H01L 31/0504; H01L 31/0508; H01L 31/06875; H01L 31/0725; H01L 31/0735; H01L 31/1844; H01L 31/044; H01L 31/0475; H01L 25/042; H01L 25/043
  See application file for complete search history.

(56) References Cited

U.S. PATENT DOCUMENTS

| 4,175,249 A | * | 11/1979 | Gruber | ............ G05F 1/67 323/271 |
| 8,604,330 B1 | * | 12/2013 | Hennessy | ........ H01L 27/1421 136/201 |
| 2004/0123894 A1 | * | 7/2004 | Erban | ............ H01L 31/02021 136/244 |

(Continued)

*Primary Examiner* — Mayla Gonzalez Ramos
(74) *Attorney, Agent, or Firm* — Teddi E. Maranzano

(57) ABSTRACT

A multi-level photovoltaic cell comprises a substrate layer and a plurality of photovoltaic cells positioned above the substrate layer. Each photovoltaic cell has a top contact layer and a bottom contact layer connected in series such that the top contact layer of the first photovoltaic cell is connected to the bottom contact layer of a next photovoltaic cell until the last photovoltaic cell is connected. A different voltage is output between the substrate layer and the top contact layer of each photovoltaic cell. Another multi-level photovoltaic cell comprises a substrate layer and a plurality of photovoltaic cells stacked vertically above the substrate layer. Each photovoltaic cell comprises an active layer separated from the next photovoltaic cell by an etch stop layer until a last photovoltaic cell is reached. A different voltage is output between the substrate layer and the active layer of each photovoltaic cell.

7 Claims, 6 Drawing Sheets

(56) References Cited

U.S. PATENT DOCUMENTS

| | | | | |
|---|---|---|---|---|
| 2009/0320897 A1* | 12/2009 | Shimomura | ............ | H01L 31/05 |
| | | | | 136/244 |
| 2010/0031994 A1* | 2/2010 | Varghese | .......... | H01L 31/06875 |
| | | | | 136/244 |
| 2012/0326178 A1* | 12/2012 | Fehrer | ............... | H01L 31/02005 |
| | | | | 257/88 |
| 2015/0280044 A1* | 10/2015 | Derkacs | .............. | H01L 31/0504 |
| | | | | 136/251 |
| 2016/0013344 A1* | 1/2016 | Flynn | .................... | H01L 31/042 |
| | | | | 136/244 |
| 2016/0204305 A1* | 7/2016 | Chiu | .................. | H01L 25/0753 |
| | | | | 257/94 |

* cited by examiner

PHOTOVOLTAIC CELL FORM ULTRA-SMALL IOT DEVICE WITH MULTI-LEVEL VOLTAGE OUTPUT

BACKGROUND

Field of Invention

The present disclosure generally relates to small device power sources, and more particularly relates to a structure and method of fabrication for small photovoltaic cells.

Description of the Related Art

As the concept of the Internet of Things (IoT) grows and electronic devices become smaller and more self-contained, smaller power sources are needed. Additionally, all IoT devices need some type of small data receiver. Some IoT devices, such as those fabricated as semiconductor devices, may have a total overall area footprint as small as 100 µm×100 µm. Each device requires a power source to operate and may be embedded into very small objects. Thus, IoT devices having a self-contained power source are highly desirable. Photovoltaic cells provide a small voltage and recharge when exposed to light. However, current photovoltaic cells do not provide enough voltage to power many IoT devices.

In addition, IoT devices may use multiple voltage levels and need higher voltages than are currently available from photovoltaic cells, thus requiring voltage converters on silicon (Si) chips.

BRIEF SUMMARY

In one embodiment, a multi-level photovoltaic cell is disclosed. The multi-level photovoltaic cell comprises a substrate layer and a plurality of photovoltaic cells positioned above the substrate layer. Each photovoltaic cell has a top contact layer and a bottom contact layer connected in series such that the top contact layer of the first photovoltaic cell is connected to the bottom contact layer of a next photovoltaic cell until the last photovoltaic cell is connected. A different voltage is output between the substrate layer and the top contact layer of each photovoltaic cell.

In another embodiment, another multi-level photovoltaic cell device is disclosed. The multi-level photovoltaic cell comprises a substrate layer and a plurality of photovoltaic cells stacked vertically above the substrate layer. Each photovoltaic cell comprises an active layer separated from the next photovoltaic cell by an etch stop layer until a last photovoltaic cell is reached. A different voltage is output between the substrate layer and the active layer of each photovoltaic cell.

In yet another embodiment, an electronic device comprising a photodetector and a multi-level photovoltaic cell is disclosed. The multi-level photovoltaic cell comprises a substrate layer and a plurality of photovoltaic cells positioned above the substrate layer and connected in series. Each photovoltaic cell comprises a top layer, wherein a different voltage is output between the substrate layer and the top layer of each photovoltaic cell. The electronic device may further comprise a processor, a memory and at least one bus connecting the processor to the memory and to the photodetector.

BRIEF DESCRIPTION OF THE SEVERAL VIEWS OF THE DRAWINGS

The accompanying figures, where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

In this disclosure, a photovoltaic cell form with multi-level voltage outputs is provided for use in ultra-small IoT devices. As many IoT devices need both a power source and a data receiver, a combination photovoltaic cell and photodetector is provided. The photovoltaic cell(s) provides the power source and the photodetector may be used as a data receiver. Multi-level voltage outputs are provided to drive different functions of the IoT device. For example, current light-emitting diodes (LEDs) require about 3-4 V while current complementary metal-oxide-semiconductor (CMOS) chips need under 1 V. The disclosed photovoltaic cells combine multiple smaller cells connected in series on the same chip to provide multiple output voltage taps.

Figure 1:
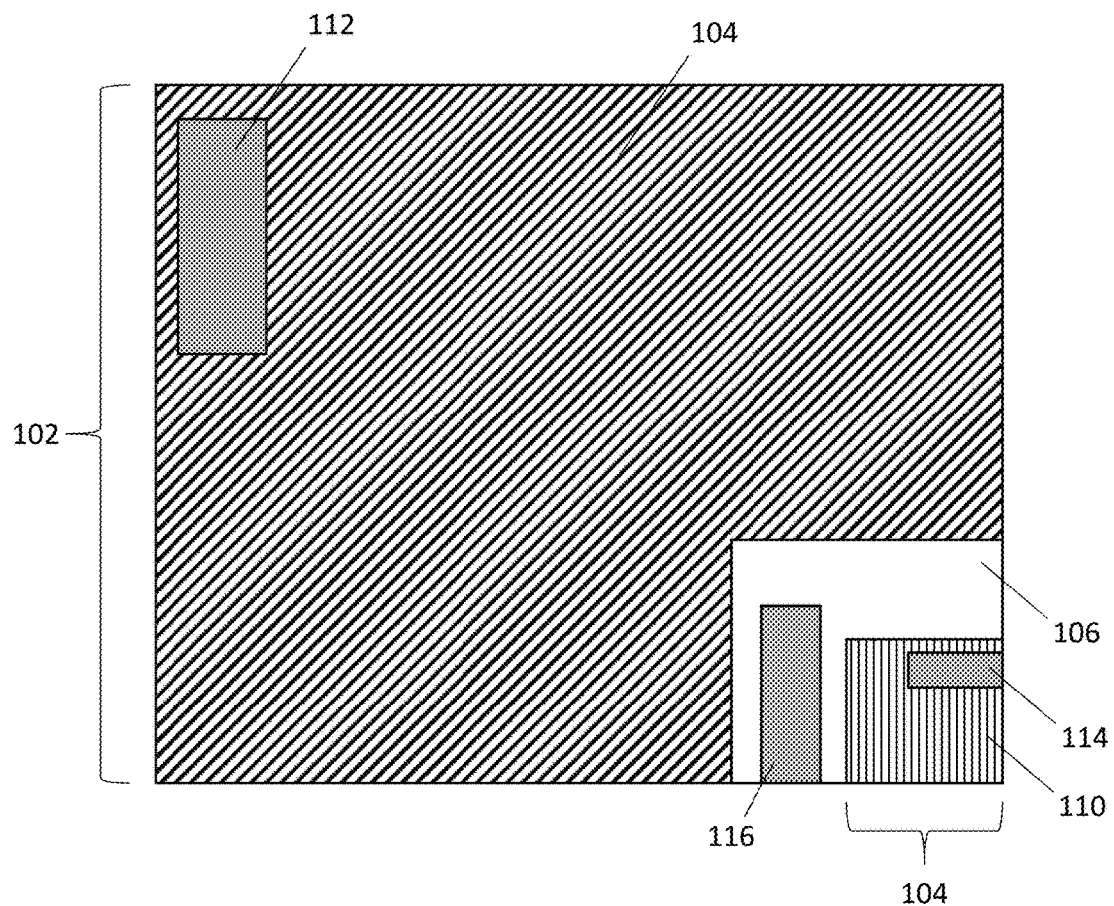
FIG. 1 is a top-side illustration of one embodiment of a combination photovoltaic cell and photodetector according to one embodiment of the present invention.
Figure 2:
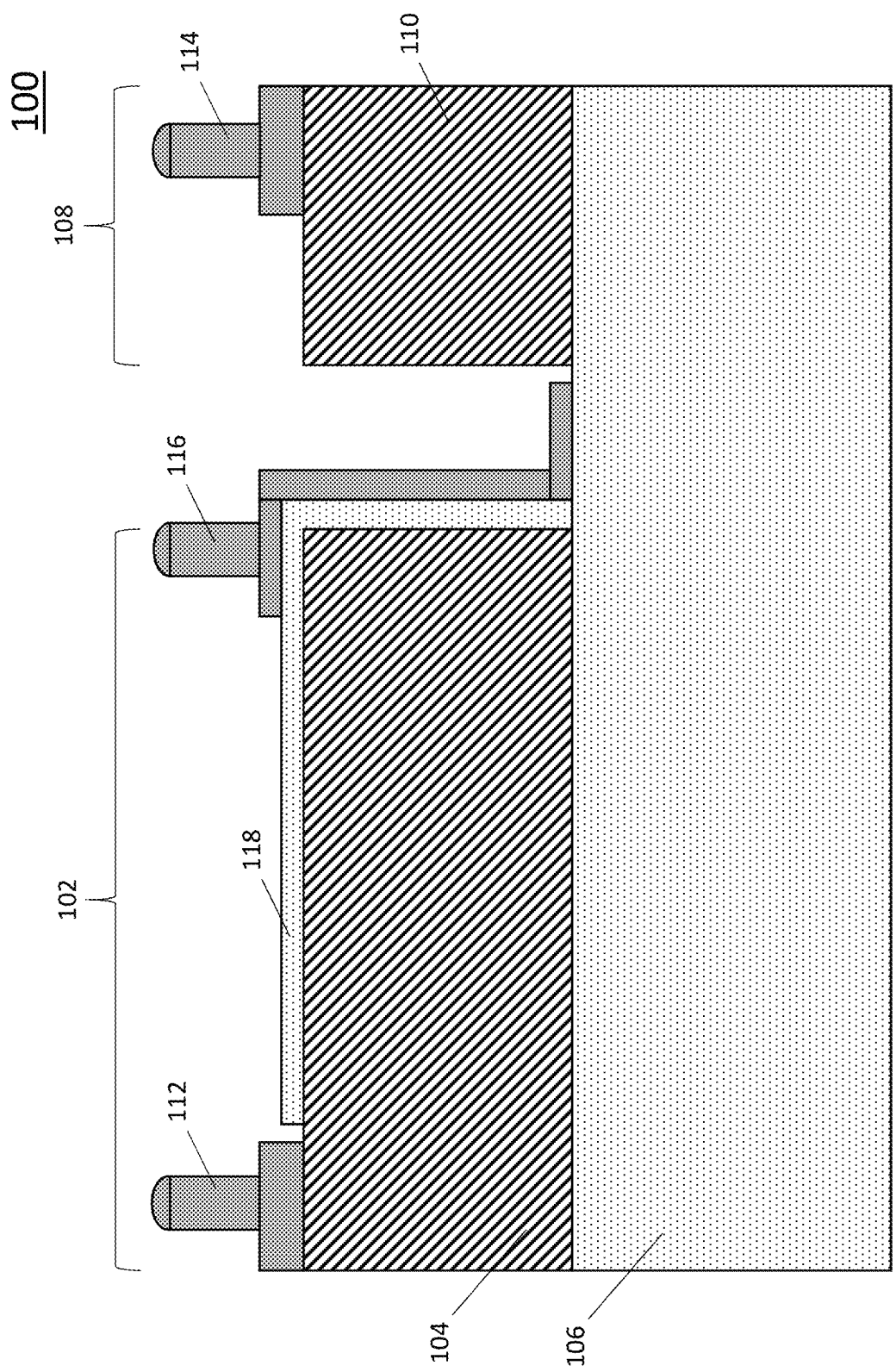
FIG. 2 is a cross-sectional illustration of the combination photovoltaic cell and photodetector of FIG. 1.

Turning now to FIGS. 1 and 2, an example photovoltaic cell/photodetector 100 is provided. FIG. 1 illustrates a top-side view of the photovoltaic cell/photodetector 100 and FIG. 2 illustrates a cross-sectional view of same photovoltaic cell/photodetector 100. It should be noted, unless otherwise stated, the figures provided herein are not drawn to scale.

The photovoltaic cell portion 102 comprises a photo-sensitive top layer 104 overlaying a substrate layer 106. The photo-sensitive top layer 10 may be formed from gallium arsenide (GaAs), gallium phosphide (GaP), silicon (Si), etc. Likewise, the photodetector portion 108 also comprises a photo-sensitive top layer 110 overlaying the same substrate layer 106, thus the substrate layer 106 provides a common ground for both the photovoltaic cell 102 and the photodetector 108. Metal contacts 112, 114, 116 allow for connection of the different portions of the device 100 to external components. Contact 112 provides direct contact to the photo-sensitive top layer 104 (i.e. the active portion) of the photovoltaic cell 102. Contact 114 provides direct contact to the photo-sensitive top layer 110 (i.e. the active portion) of the photodetector 108. Contact 116 extends downward and provides direct contact to the substrate 106 (i.e. the common ground). A small insulating layer 118 insulates metal contact 116 from the photo-sensitive top layer 108 of the photovoltaic cell 102. The substrate layer 106 may be formed of Silicon, GaAs, InP, GaN, Sapphire, Ge, SOI; insulator: SiO2, Al2O3, or any other insulator.

It should be noted that the total surface area of the photovoltaic cell 102 and the photodetector 102 should be minimized as they are both on the top surface of the same chip. The total surface dimensions may typically be around 100μ×100μ.

Figure 3:
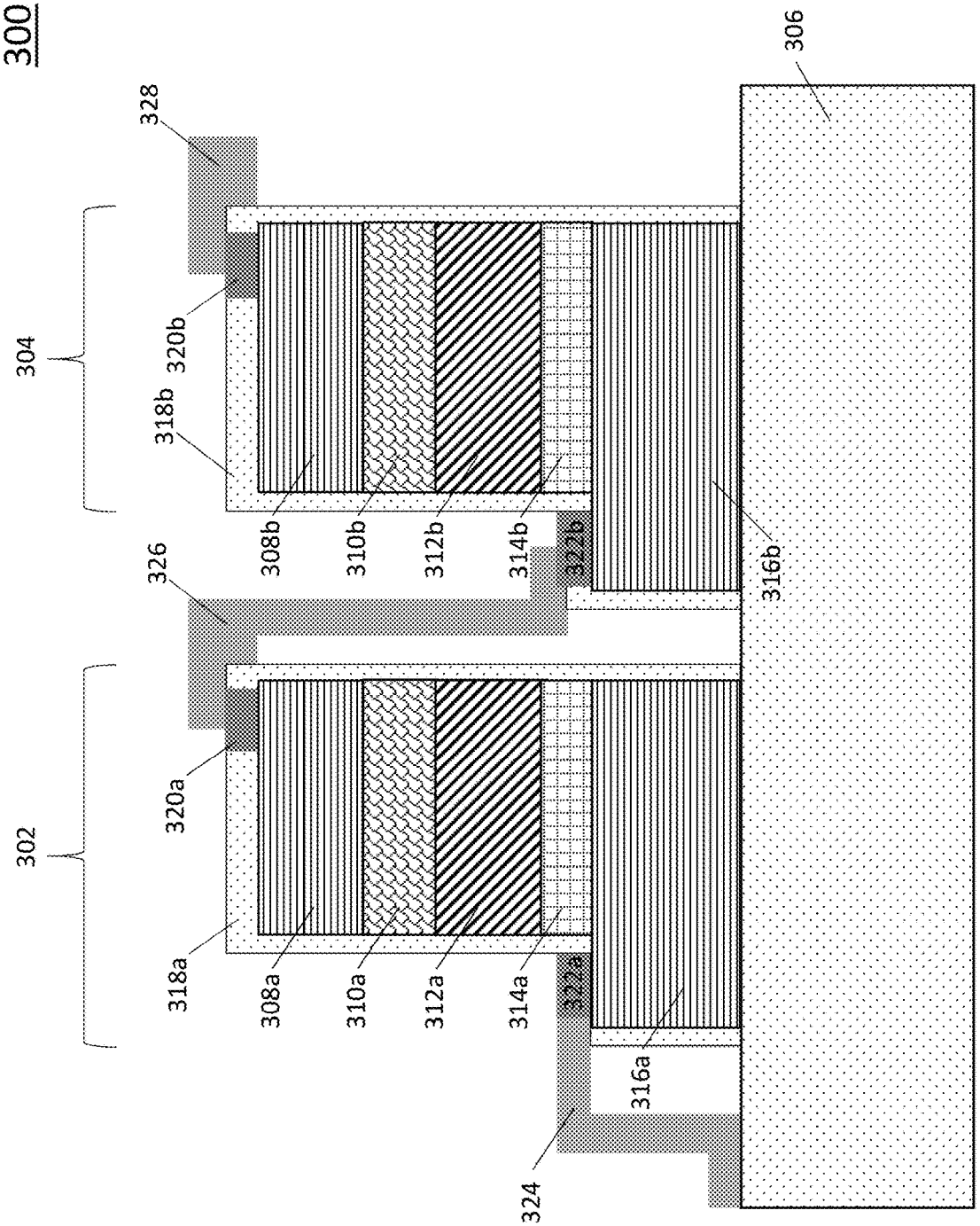
FIG. 3 is a cross-sectional illustration of two photovoltaic cells connected in series in a horizontal plane according to one embodiment of the present invention.

Referring now to FIG. 3, a cross-sectional view of a multi-level photovoltaic cell 300 is provided. Multi-level photovoltaic cell 300 comprises two individual photovoltaic cells 302, 304 connected in series upon a semi-insulating substrate 306. Each individual photovoltaic cell 302, 304 comprises a vertical stack-up of a top contact layer 308, a window layer 310, a GaAs junction layer 312, an indium gallium phosphide (InGaP) back-surface-field (BSF) layer 314 and a bottom contact layer 316. The individual components of photovoltaic cells 302 and 304 are denoted in FIG. 3 as 308a and 308b, etc., when discussed generally herein, the "a" or "b" designation is not differentiated for sake of clarity. Each photovoltaic cell 302, 304 is surrounded by an insulating layer 318. Small metal contacts 320, 322 are embedded within the insulating layer 318 and attached to the bottom contact layer 316 and the top contact layer 308, respectively.

A first metallic connector 324 attaches to the small metal bottom contact 320 and connects the bottom contact layer 316 of the first photovoltaic cell 302 to the substrate layer 306, providing a ground level to the multi-level photovoltaic cell 300. In addition, the first metallic connector 324 allows for connection of the multi-level photovoltaic cell 300 to a common device ground.

A first output voltage is available between the small metal top contact 322a of the first photovoltaic cell 302 and the ground at connector 324. The first output voltage may be around 1V. A second metallic connector 326 connects the top contact layer 308a of the first photovoltaic cell 302 to the bottom contact layer 316b of the second photovoltaic cell 304. A second output voltage is available between the small metal top contact 322b of the second photovoltaic cell 304 and the ground at connector 324. The second output voltage is approximately double the voltage level of the first output voltage (i.e. ~2V).

Additional photovoltaic cells may be attached in series as described above to provide additional output voltage levels. There is no limit to the number of cells that may be connected. The only limitation is the available size. The size of the photovoltaic cells is chosen based on how much current is needed at each voltage level. For example, if more current is needed at 1V, but much less current is needed at 2V and 3V, the construction of the overall photovoltaic cell may include one large cell and two smaller cells.

Figure 4:
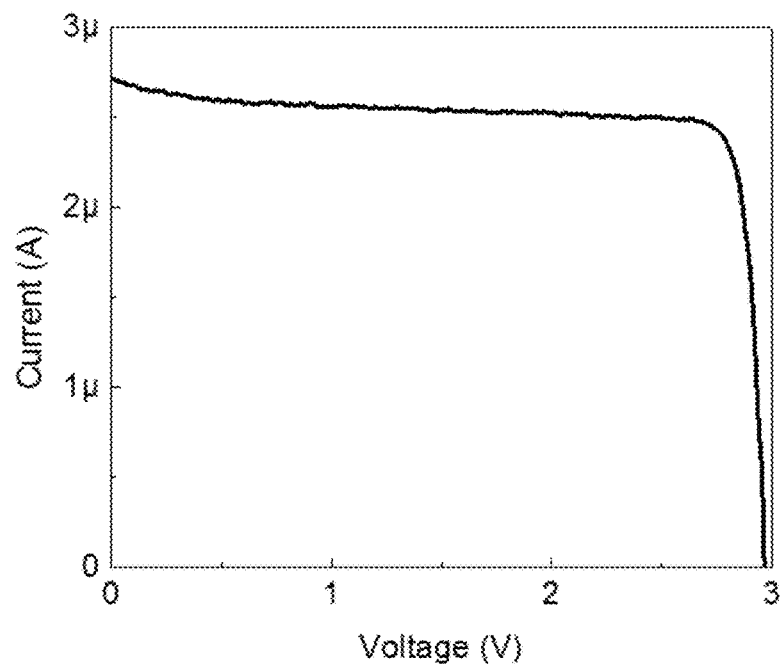
FIG. 4 is a current versus voltage graph showing output characteristics of a multi-level photovoltaic cell comprising three photovoltaic cells connected in series, in accordance with an embodiment of the present invention.

FIG. 4 is a graph 400 illustrating the current vs. voltage characteristics of an example multi-level photovoltaic cell consisting of three individual photovoltaic cells connected in series. Presently, samples of three 100μ×100μ sized photovoltaic cells connected in series are capable of sourcing around 2.5 μA of current to just under 3V.

Figure 5:
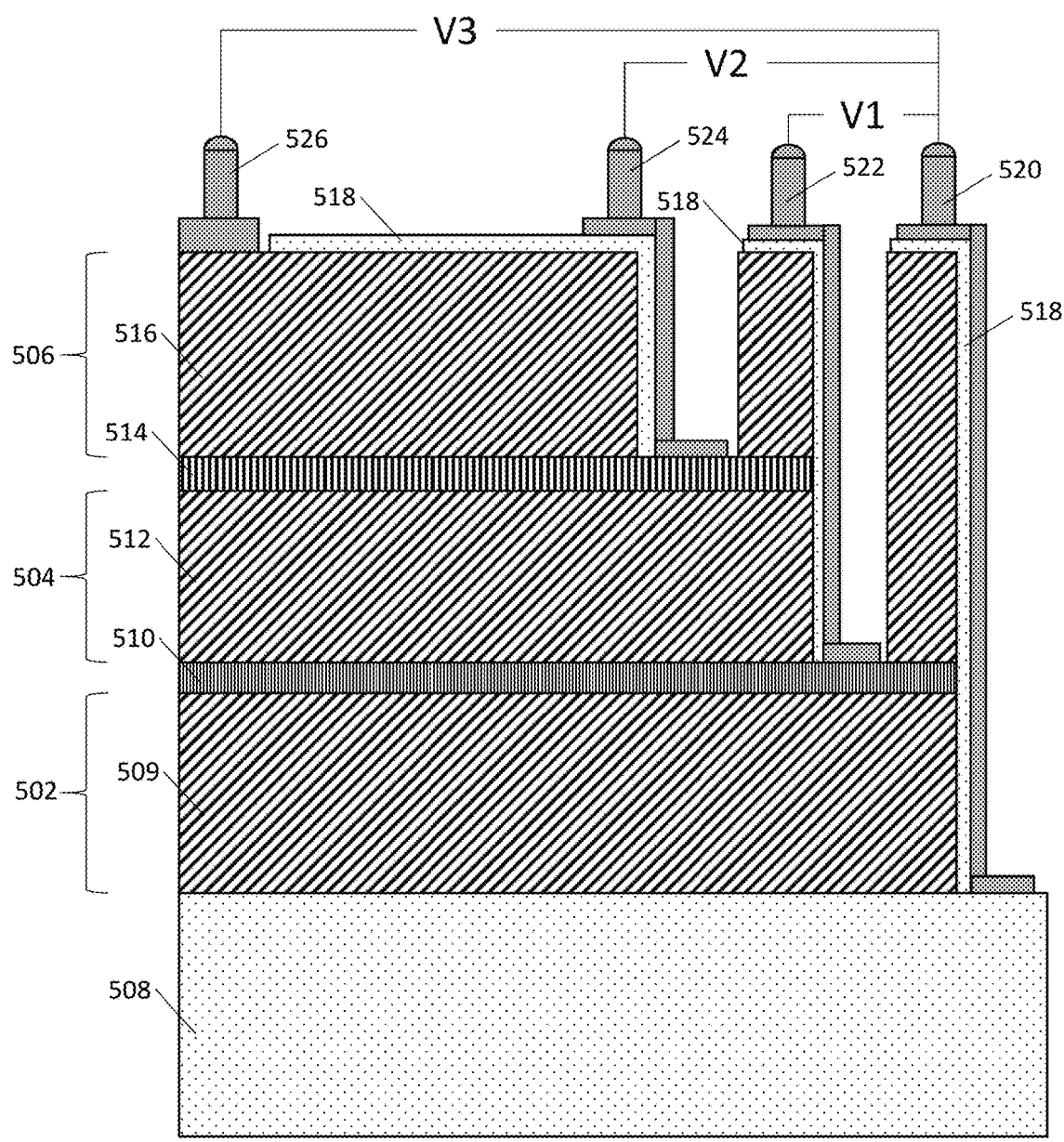
FIG. 5 is a cross-sectional illustration of three photovoltaic cells stacked in series in a vertical plane according to one embodiment of the present invention.

FIG. 5 is a cross-sectional view of an alternate embodiment of a multi-level photovoltaic cell 500 wherein individual photovoltaic cells 502, 504, 506 are stacked vertically upon a substrate layer 508 and connected in series. A first active layer 509 for photovoltaic cell 502 is deposited upon substrate 508 and a first etch stop layer 510 is deposited over the first active layer 502. A second active layer 512 is deposited over the first etch stop layer 510, followed by a second etch stop layer 514 and a third active layer 516 for photovoltaic cell 506. The multi-level photovoltaic cell 500 is etched such that the etch stop layers 514, 510 and the substrate layer 508 are exposed in a staircase-like fashion with the top-most photovoltaic cell 506 having a shorter length than the photovoltaic cell 504 immediately below, which is shorter than the length of the bottom-most photovoltaic cell 502. An insulating layer 518 is deposited over the multi-level photovoltaic cell 500, which is then re-etched to expose the etch stop layers 514, 510 and the substrate layer 508.

Metal contacts 520, 522, 524, 526 are attached to substrate 508, first etch stop layer 510, second etch stop layer 514 and the active layer 516 of photovoltaic cell 506. Three different output voltages V1, V2 and V3 are available between ground and the active portion of each photovoltaic cell 502, 504, 506. The output voltage at photovoltaic cell 502 is V1; the output voltage at photovoltaic cell 504 is V2; and the output voltage at photovoltaic cell 506 is V3, wherein V3>V2>V1. It should be noted that due to the non-identical structure of the photovoltaic 502, 504, 506, the increase in available output voltage of each photovoltaic cell 502, 504, 506 may not be identical. Additionally, each top layer should be thin enough so that some light passes through in order to charge the underlying active layers 509, 512. The thickness of the layers depends on the wavelength of light and the absorption materials. Usually, the layers are from a few hundred nanometers to a few microns thick.

Figure 6:
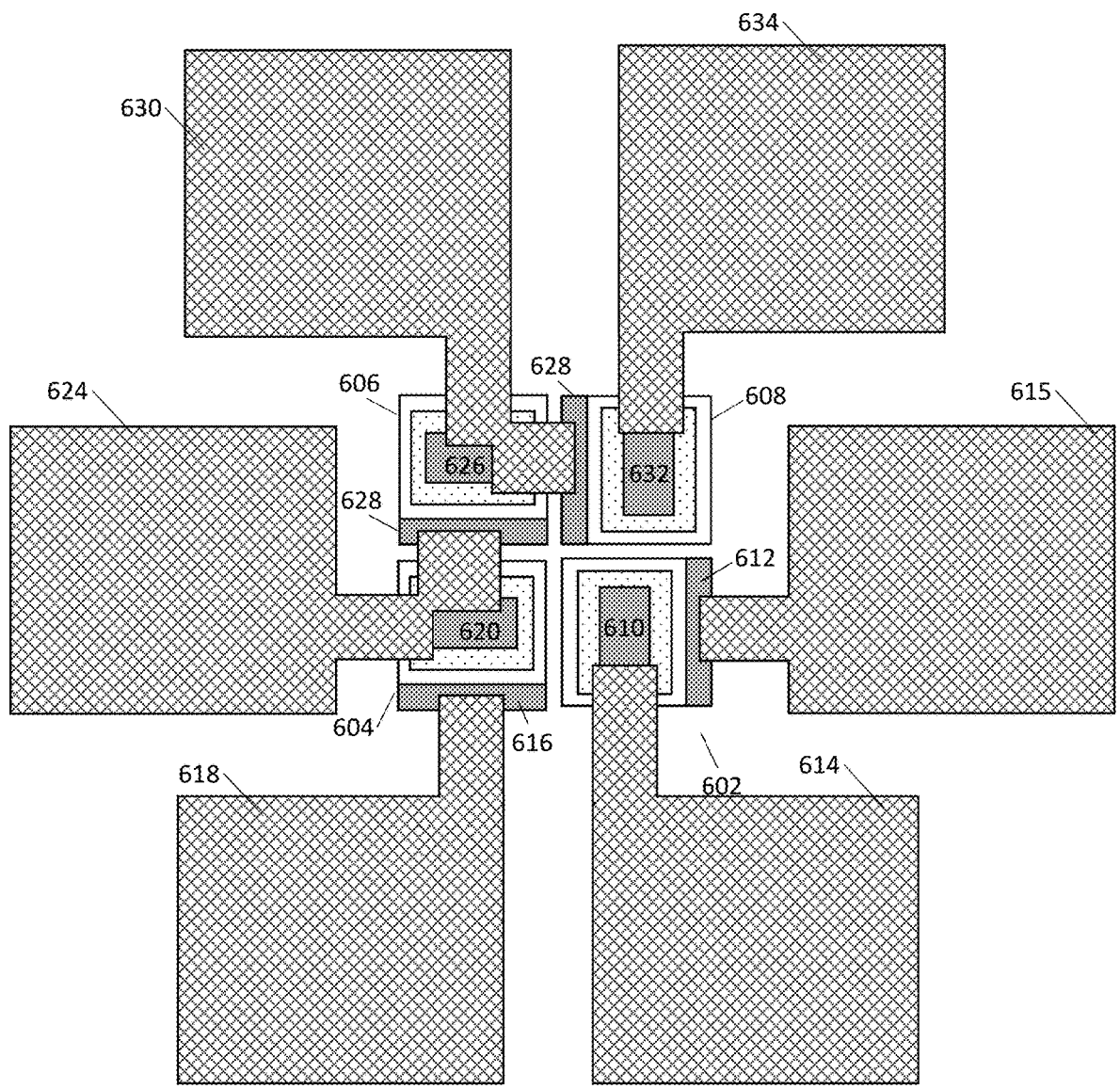
FIG. 6 is a top-side illustration of a device having a photodetector and three photovoltaic cells according to one embodiment of the present invention.

FIG. 6 is a top-side view of a fabricated IoT device 600 comprising a photodetector 602 and three individual photovoltaic cells 604, 606, 608 connected in series. Each individual device (i.e. photodetector 602 and photovoltaic cells 604, 606, 608) are approximately 100μ×100μ. Additionally, each device has an active top layer and a bottom layer. The active top layer 610 of photodetector 602 is where the detected signal is input and the bottom layer 612 (e.g., a substrate layer) is connected to ground. Top layer 610 is connected to a metallic photodetector (PD) signal pin 614 and a PD ground pin 615, which allows for connection to external components.

Additionally, the bottom layer 616 of photovoltaic cell 604 connects to a metallic photovoltaic (PV) ground pin 618. The top layer 620 of photovoltaic cell 604 connects to the bottom layer 622 of photovoltaic cell 606 and to metallic pin 624 where V1 (e.g., ~1V) is output. The top layer 626 of photovoltaic cell 606 connects to the bottom layer 628 of photovoltaic cell 608 and to metallic pin 630 where V2 (e.g., ~2V) is output. The top layer 632 of photovoltaic cell 608 connects to metallic pin 634 where V3 (e.g., ~3V) is output.

Figure 7:
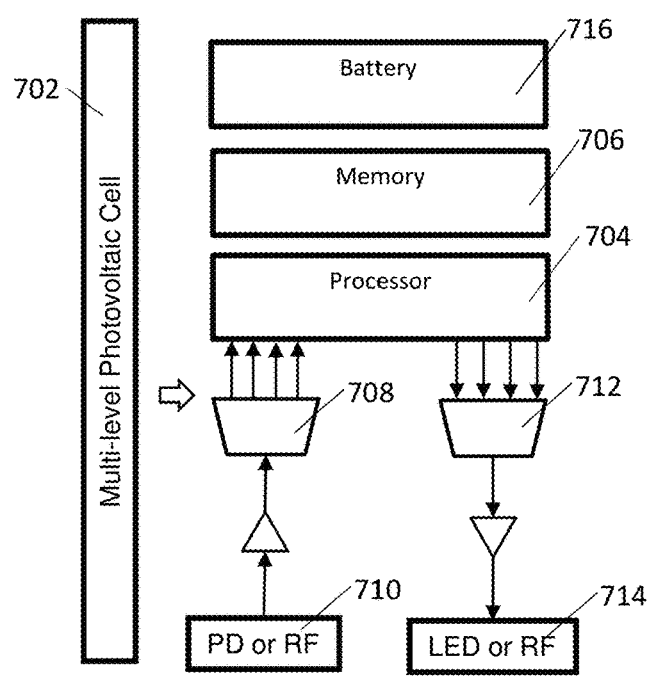
FIG. 7 is a block diagram of an IoT device driven by a combination photovoltaic cell and photodetector according to one embodiment of the present invention.

Referring now to FIG. 7, an example block diagram of an IoT device 700 powered by multi-level photovoltaic cell 702 is provided. The components of the IoT device 700 can include, but are not limited to, one or more processors or processing units 704, a system memory 706, an input bus 708 that couples various system components including photodetector 710 to the processor 704, an output bus 712 that couples other system components including LED 714 to the processor 704. It should be noted that input bus 708 and output bus 712 may be a single shared bus or individual busses. In addition, the input and/or output devices may be an RF signal instead of or in addition to the PD 710 and the LED 714.

PV 702 provides energy to directly power the components of IoT device 700, or charges battery 716, which, in turn, provides power to the remaining components.

The entirety of IoT device 700 may be fabricated as a single chip.

Non-Limiting Embodiments

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/ dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A multi-level photovoltaic cell, comprising:
   a substrate layer;
   a plurality of photovoltaic cells positioned above the substrate layer, each photovoltaic cell surrounded by an insulating layer and comprising a top contact layer having a first metal contact and a bottom contact layer having a second metal contact connected in series by a metallic connector, the first metal contact and the second metal contact embedded within the insulating layer, the metallic connector having a proximal horizontal end and a distal horizontal end connected at right angles to a vertical body such that the vertical body extends downward perpendicularly to the substrate layer thereby connecting the first metal contact of a first photovoltaic cell via the proximal horizontal end to the second metal contact of a next photovoltaic cell via the distal horizontal end until a last photovoltaic cell is connected, wherein a different voltage is output between the substrate layer and the top contact layer of each photovoltaic cell, and wherein at least two photovoltaic cells of the plurality of photovoltaic cells have different surface areas; and
   a photodetector sharing a common ground with each photovoltaic cell.

2. The multi-level photovoltaic cell of claim 1, wherein the top contact layer comprises gallium arsenide (GaAs).

3. The multi-level photovoltaic cell of claim 1, wherein the top contact layer comprises gallium phosphide (GaP).

4. The multi-level photovoltaic cell of claim 1, wherein the top contact layer comprises silicon (Si).

5. The multi-level photovoltaic cell of claim 1, wherein each photovoltaic cell is located in a same horizontal plane.

6. The multi-level photovoltaic cell of claim 1, wherein each photovoltaic cell has a length of approximately 100 μm and a width of approximately 100 μm.

7. The multi-level photovoltaic cell of claim 1, wherein each photovoltaic cell further comprises:
   a window layer positioned below the top contact layer, a gallium arsenide layer (GaAs) junction layer positioned below the window layer; and an indium gallium phosphide (InGaP) back-surface-field (BSF) layer positioned below the GaAs junction layer and above the bottom contact layer.

* * * * *